United States Patent [19]

Benamy

[11] Patent Number: 4,555,793
[45] Date of Patent: Nov. 26, 1985

[54] AVERAGING NON-INTEGER FREQUENCY DIVISION APPARATUS

[75] Inventor: Daniel A. Benamy, Teaneck, N.J.

[73] Assignee: Allied Corporation, Morristown, N.J.

[21] Appl. No.: 555,783

[22] Filed: Nov. 28, 1983

[51] Int. Cl.$^4$ ............................................. H03K 21/36
[52] U.S. Cl. ........................................ 377/48; 377/49; 377/52; 377/54
[58] Field of Search ...................... 377/47, 48, 52, 54, 377/49

[56] References Cited

U.S. PATENT DOCUMENTS

| | | | |
|---|---|---|---|
| 3,818,354 | 6/1974 | Tomisawa et al. | 377/48 |
| 4,041,403 | 8/1977 | Chiapparoli | 377/48 |
| 4,084,082 | 4/1978 | Alfke | 377/47 |
| 4,295,158 | 10/1981 | Nissen et al. | 377/48 |
| 4,318,046 | 3/1982 | Sonntag | 377/48 |
| 4,390,960 | 6/1983 | Yamashita et al. | 377/54 |
| 4,468,797 | 8/1984 | Shin | 377/47 |

*Primary Examiner*—John S. Heyman
*Attorney, Agent, or Firm*—Howard G. Massung; Stanley N. Protigal; Anthony F. Cuoco

[57] ABSTRACT

Apparatus is disclosed wherein the average period of a synthesized signal is a non-integral multiple of the period of a given signal. The apparatus is arranged so that a counter alternates its count between N and N+1, wherein N is a predetermined integer, in a predetermined pattern so that the average count approximates a rational non-integral value between N and N+1.

6 Claims, 1 Drawing Figure

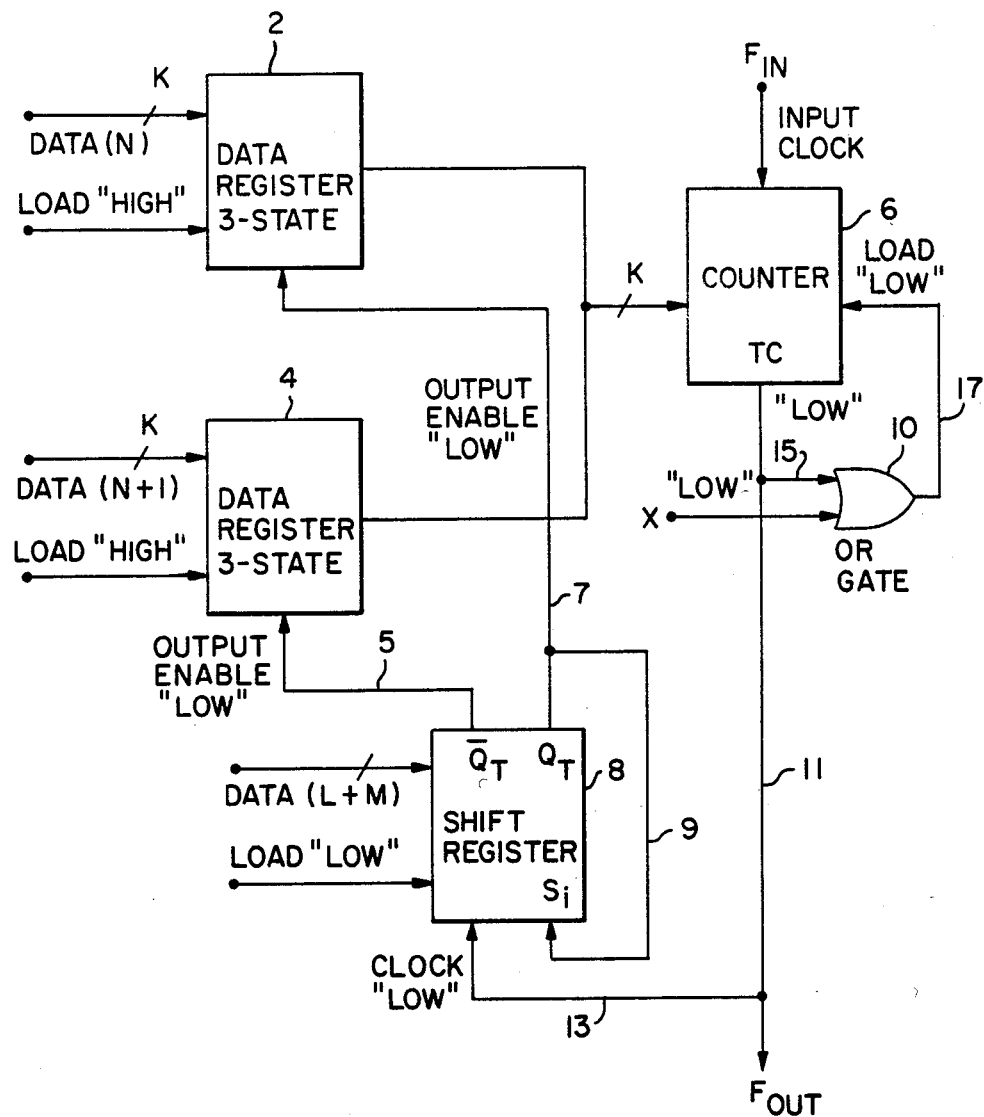

AVERAGING NON-INTEGER FREQUENCY DIVISION APPARATUS

BACKGROUND OF THE INVENTION

In many electronic systems, especially those involving pulse and digital techniques, the need arises to generate a signal having a period which is some multiple, not necessarily an integer, of a given (periodic) signal. Heretofore, such frequency division or synthesis has employed locked oscillators or phase-locked loops.

However, in some cases it is sufficient that the average period of the synthesized signal be some large non-integral multiple of the given signal's period. In this event, other structural arrangements may be more suitable.

For example, given a periodic signal having a rate R and a period 1/R, it is desired to generate another signal whose period P is $\lambda/R$ where $\lambda > 1$. If $\lambda$ is an integer N, it is sufficient to load a down-counter with the value N and clock it at the rate R. At the counter's terminal count (zero), an output is produced which is used to reload the counter with N. The terminal count (TC) signal thus has a period NP, as desired.

In order to increase the period it is necessary to load the counter with a larger value. If the larger value is N+1 and this value is loaded L times while N is loaded M times, then for (L+M) terminal counts the number of input pulses will be $L(N+1)+M(N)=N(L+M)+L$, and the average TC period will be $1/(L+M)$ times this value, multiplied by P, that is $P(N+L/(L+M))$.

Thus, for example, if $L+M=10$, average fractional frequency division to an accuracy of one part in $2(10N+L)$ can be obtained.

SUMMARY OF THE INVENTION

This invention contemplates a pair of data registers which provide inputs to a counter such as a down-counter. The counter is clocked by an input at a frequency to be divided and provides an output at a frequency which is the input frequency divided by the count of the counter. The pair of data registers are loaded with digital values and a selected pattern of bits is loaded into a shift register providing complementary outputs which enable one or the other of the data registers. The present value of the shift register output is fed back to the shift register so that the initial pattern, once loaded, circulates as long as the shift register is clocked by the terminal count of the counter, which also reloads the counter. The pattern is selected so that in a predetermined number of clocks to the shift register, the digital values are loaded into the counter a predetermined number of times. The arrangement is such that the counter alternates its count value between two integers in the loaded pattern, so that the average count value approximates a rational non-integral value between the two integers. It is to be understood that while a down-counter is described for purposes of illustration the only requirement is that the counter be a "presettable counter" with a terminal count output, and in this respect the counter may be either an up-counter or a down-counter.

BRIEF DESCRIPTION OF THE DRAWING

The single FIGURE in the drawing is a block diagram showing a preferred embodiment of the invention.

DETAILED DESCRIPTION OF THE INVENTION

A pair of data registers are designated by the numerals 2 and 4. Data registers 2 and 4 may be, for example, as assembly of K conventional edge-triggered D flip-flops with three-state outputs, wherein K is a predetermined integer. Data registers of this type are conventional and well known in the art. Each of the data registers 2 and 4 has K parallel data input lines and a single load input line.

The outputs of data registers 2 and 4 are connected in parallel and are applied as inputs to a counter 6, which may be, for example, a K bit down-counter clocked by a suitable input at a frequency designated as $F_{in}$. Input frequency $F_{in}$ is the frequency to be divided.

Data registers 2 and 4 are loaded with digital values of N and N+1 over their respective parallel input lines when a load signal applied over their respective load input lines is at, for example, a logic "high" level.

A pattern of (L+M) bits is loaded into an (L+M) length serial shift register 8 upon a load signal applied over a single input line being at, for example, a logic "low" level. Shift register 8 provides simultaneous complementary outputs $Q_T$ and $\overline{Q}_T$. Shift register 8 is of a conventional type well known in the art.

Shift register 8 enables the outputs of either data registers 2 or 4 via lines 5 or 7, depending on the present value of the output of shift register 8 at a logic "low" level. The present value of the shift register output, shown as $Q_T$, is also fed back to its serial input $S_i$ via a line 9 connected to line 7 and to input $S_i$, so that the pattern, once loaded into the shift register, continues to circulate as long as the shift register is clocked. Shift register 8 is clocked with a terminal count (TC) output at a logic "low" level from counter 6 via lines 11 and 13.

Down-counter 6 is loaded by the TC output applied over a line 15 through an OR gate 10, and therefrom to counter 6 over a line 17. The output of gate 10 is at a logic "low" level.

The pattern with which shift register 8 is loaded is selected so that in (L+M) shifts (clocks) to shift register 8, N is loaded M times and N+1 is loaded L times into counter 6. Thus, to produce (L+M) pulses of $F_{out}$, which is $F_{in}$ divided by the count of counter 6, requires L (N+1) plus M (N) pulses of $F_{in}$. In other words, on the average, $F_{in}$ equals $<F_{out}> (N+L/(L+M))$, where $<F_{out}>$ is the average value of $F_{out}$.

To minimize accumulated departures from the average output rate, it is desirable that the predetermined pattern, which consists of ones and zeros, be chosen in a way that distributes the alternations in count in a uniform a manner as possible.

After registers 2 and 4 have been loaded, counter 6 is loaded by a "low" pulse X applied to gate 10. This insures that counter 6 starts counting (clocking) from a known state rather that from an arbitrary state. Data registers 2 and 4 and shift register 8 need only be loaded once, that is, "initialized" for any given division ratio.

It will now be recognized that apparatus has been provided wherein the average period of a synthesized signal is some large non-integral multiple of the period of a given signal. In concept, counter 6 alternates its count value between N and N+1 in accordance with a predetermined pattern so that the average count value approximates a rational non-integral value between N and N+1.

With the aforenoted description of the invention in mind, reference is had to the appended claims for a definition of the scope of the invention.

What is claimed is:

1. Frequency dividing apparatus, characterized by:

data register means loaded with digital inputs and providing corresponding outputs, said data register means including a first register having a plurality of parallel data input lines and responsive to a load input at a predetermined logic level for loading digital inputs corresponding to an integer N and a second data register having a plurality of parallel data input lines and responsive to the load input at the predetermined logic level for loading digital inputs corresponding to an integer (N+1);

counter means clocked by an input at a frequency to be divided, and responsive to the outputs from the data register means for providing an output at a frequency corresponding to the input frequency divided by the count of the counter means;

shift register means loaded with a perdetermined pattern of bits and clocked by the output of the counter means for providing outputs which enable the data register means, whereby for a predetermined number of clocks to the shift register means the digital inputs loaded into the data register means are loaded into the counter means a predetermined number of times, the shift register means being an (L+M) length shift register, with a pattern of (L+M) bits being loaded into the shift register in response to a load input at a predetermined logic level, and the shift register being clocked by the output of the counter means for providing a first output and a second output complementary to the first output, one of the first and second data register outputs being enabled by one of the first and second shift register outputs, depending upon the present value of said shift register outputs, for applying one of the N and (N+1) integers to the counter means, and the counter means alternating its count between two integers in the predetermined pattern so that the average count approximates a rational non-integral value between the two integers.

2. Apparatus as described in claim 1, further characterized by:

integer N being loaded into the counter means M times and integer (N+1) being loaded into the counter L times.

3. Apparatus as described in claim 2, further characterized by:

(L+M) pulses at the output frequency being provided by L (N+1) plus M(N) pulses of the input frequency, with the input frequency equal to the average value of the output frequency multipled by (N+L/(M+N)).

4. Apparatus as described by claim 1, further characterized by:

the present value of the shift register means output being fed back as an input so that the pattern loaded into the shift register means circulates as long as said shift register means is clocked.

5. Apparatus as described by claim 1, further characterized by:

gating means connected to the output of the counter means and to an input thereof, whereupon the counter means is loaded in response to its output corresponding to the input frequency divided by the count of the counter means.

6. Apparatus as described by claim 5, further characterized by:

the counter means being loaded after the shift register means is loaded by an input to the gating means at a predetermined logic level, whereupon the counter means starts counting from a known state.

* * * * *